(12) United States Patent
Yagi et al.

(10) Patent No.: US 6,899,918 B2
(45) Date of Patent: *May 31, 2005

(54) METHOD FOR MANUFACTURING ELECTRODE FOR LITHIUM SECONDARY BATTERY

(75) Inventors: Hiromasa Yagi, Nishinomiya (JP); Hisaki Tarui, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 161 days.

This patent is subject to a terminal disclaimer.

(21) Appl. No.: 10/345,979

(22) Filed: Jan. 17, 2003

(65) Prior Publication Data

US 2003/0138554 A1 Jul. 24, 2003

(30) Foreign Application Priority Data

Jan. 17, 2002 (JP) ........................................ 2002-008119

(51) Int. Cl.[7] ................................................. B05D 5/12
(52) U.S. Cl. ............... 427/115; 427/126.3; 427/255.31; 427/255.7; 204/192.32
(58) Field of Search ............................. 427/115, 126.3, 427/255.31, 255.7, 255.29, 58; 204/192.32, 192.1; 216/13

(56) References Cited

U.S. PATENT DOCUMENTS

| | | | | |
|---|---|---|---|---|
| 6,235,427 B1 | * | 5/2001 | Idota et al. | 429/218.1 |
| 6,284,412 B1 | * | 9/2001 | Minakata et al. | 429/303 |
| 6,451,485 B1 | * | 9/2002 | James et al. | 429/232 |
| 6,610,357 B2 | * | 8/2003 | Endo et al. | 427/172 |
| 6,649,033 B2 | * | 11/2003 | Yagi et al. | 204/192.23 |
| 6,664,004 B2 | * | 12/2003 | Krause et al. | 429/232 |
| 6,743,369 B2 | * | 6/2004 | Jito et al. | 216/13 |
| 6,764,791 B2 | * | 7/2004 | Tamura et al. | 429/231.95 |

FOREIGN PATENT DOCUMENTS

| | | |
|---|---|---|
| JP | 06-333925 A | 12/1994 |
| JP | 07-326783 A | 12/1995 |

* cited by examiner

*Primary Examiner*—Bret Chen
(74) *Attorney, Agent, or Firm*—Kubovcik & Kubovcik

(57) ABSTRACT

A method for manufacturing an electrode for a lithium secondary battery includes a step of forming an oxide film other than a natural oxide film on a current collector by oxidizing the surface of the current collector, and a step of forming an active material layer on the oxide film by a method to provide a material for the active material layer by emitting in the vapor phase, such as PVD (physical vapor deposition) including sputtering, vapor evaporation, and the like, and CVD (chemical vapor deposition) including plasma CVD.

8 Claims, 2 Drawing Sheets

US 6,899,918 B2

METHOD FOR MANUFACTURING ELECTRODE FOR LITHIUM SECONDARY BATTERY

FIELD OF THE INVENTION

The present invention relates to a method for manufacturing an electrode for a lithium secondary battery. Specifically, the present invention is characterized by a formation process of an active material layer on a current collector.

BACKGROUND OF THE INVENTION

Performance, for example, charge-discharge characteristics, charge-discharge cycle characteristics, storage characteristics, and the like, of a lithium secondary battery, which has recently been under intensive research and development, is highly dependent on electrodes used for the battery. This has led to attempts to improve battery performance by improving an active electrode material.

It is known that a battery having lithium metal as a negative electrode active material can provide high energy density per weight and volume. Lithium is deposited on the negative electrode when the battery is charged, and lithium is dissolved when the battery is discharged. When charge and discharge are repeated, deposition and dissolution of lithium in the battery are also repeated. Lithium deposited on the negative electrode grows into dendrite which could cause internal short-circuiting.

A lithium secondary battery is proposed that has aluminum, silicon (Si), germanium (Ge), tin (Sn), or the like, as a negative electrode material to inhibit deposition of lithium as dendrite. These elements can electrochemically alloy with lithium when the battery is charged. These have been reported in Solid State Ionics, 113–115, p57 (1998), and the like. Specifically, among the above described materials, Si and Ge are promising as a negative electrode active material to provide a high capacity because they have a high theoretical capacity.

The inventors of the present invention proposed a method to form an active material layer consisting of fine crystal or amorphous Si on a current collector by a film forming method, for example, CVD, sputtering, vapor evaporation, and the like. In a method of preparation of a lithium secondary battery proposed by the inventors, Si thin film was formed by sputtering and the like, to directly deposit Si on a current collector of a metallic film.

However, it is difficult to control reaction and diffusion at a boundary between the active material layer and current collector when the active material layer is formed directly on the current collector by sputtering. Especially, when an active material layer containing Si or Ge is formed on a copper (Cu) current collector, there is a problem that reaction and diffusion are excessive at a boundary between the active material layer and current collector because diffusion coefficients of Si and Ge in Cu are very large. As a result, charge-discharge characteristics of the active material layer are deteriorated. There is also a problem that a reacted product between the active material layer and current collector at the boundary makes the electrodes fragile and deteriorates charge-discharge cycle characteristics.

There is another problem that when reaction and diffusion are not performed at the boundary between the active material layer and current collector, adhesion at the boundary tends to be insufficient and the active material layer easily comes off.

Therefore, it is important to control reaction and diffusion between the active material layer and current collector at a boundary in order to manufacture electrodes having excellent charge-discharge cycle characteristics.

OBJECTS OF THE INVENTION

The present invention was made to solve the above-described problems. One object of the present invention is to provide a method for manufacturing an electrode for a lithium secondary battery which can provide a lithium secondary battery having excellent charge-discharge cycle characteristics.

Another object of the present invention is to evenly and suitably control a diffusion rate of a current collector material in the active material layer.

SUMMARY OF THE INVENTION

To accomplish the above-described objects, the present invention provides a method for manufacturing an electrode for a lithium secondary battery including a step of forming an oxide film (other that a naturally formed film) by oxidizing a surface of a current collector, followed by a step of forming an active layer containing at least one of Si and Ge on the current collector by a method to provide a material by emitting in a vapor phase. The terminology "a method to provide a material by emitting in a vapor phase" used herein is a broad concept including, for example, PVD (physical vapor deposition) including sputtering, vapor evaporation, and the like, and CVD (chemical vapor deposition) including plasma CVD.

EXPLANATION OF ELEMENTS

Figure 1:
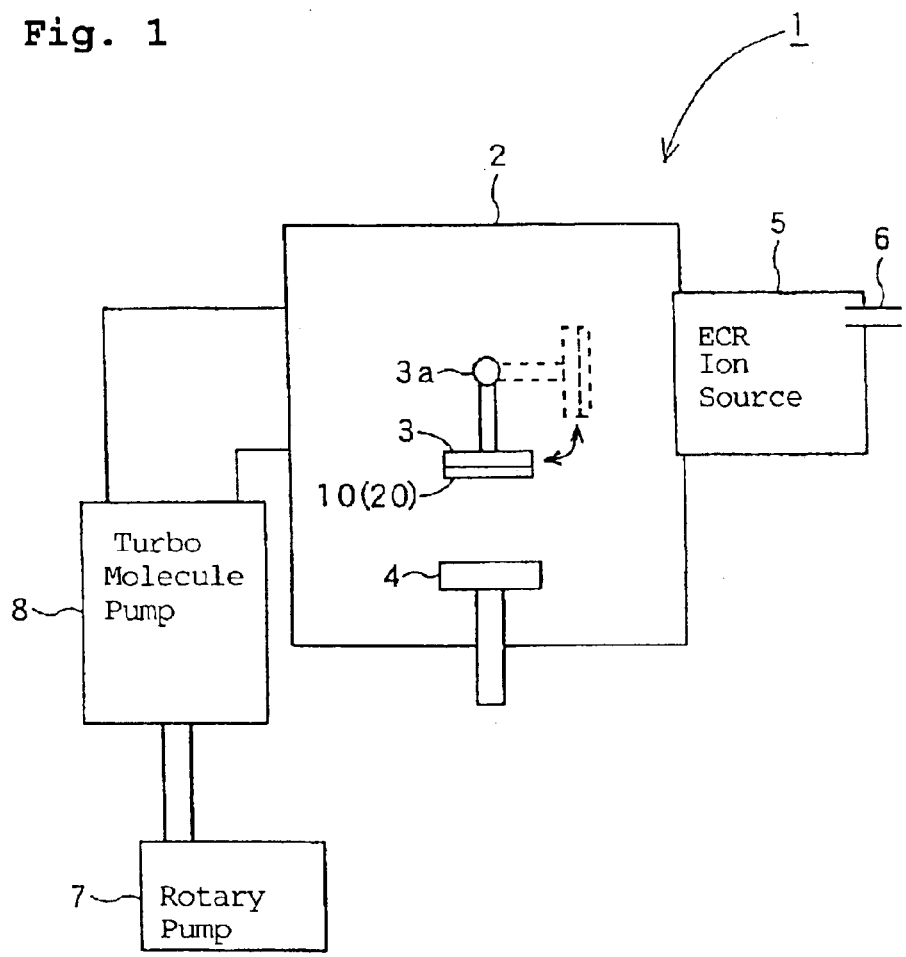
FIG. 1 is a drawing illustrating a structure of an electrode manufacturing apparatus used in the examples and comparative examples.

1: electrode manufacturing apparatus
2: chamber
3: substrate holder
3a: axis of rotation
4: sputter source
5: ECR ion source
6: gas supply line
7: rotary pump
8: turbo molecule pump
10 (20): current collector
11 (21): oxide film (not naturally formed)
12 (22): active-material layer
23: cracks
23a: depressions (valleys)

DETAILED EXPLANATION OF THE INVENTION

The method for manufacturing an electrode for a lithium secondary battery of the present invention makes it possible to inhibit excessive diffusion of a material of a current collector into the active material layer by forming an active material layer including at least one of Si and Ge on the current collector after an oxidation treatment of the surface of the current collector. The material of the current collector is diffused appropriately into the active material layer, and charge-discharge capacity of the battery can be increased and a battery having excellent charge-discharge cycle characteristics can be obtained. A uniform oxide film can be duplicated well by the present invention, that is, the oxide film which is not naturally formed is formed by oxidation treatment. This makes it possible to evenly and suitably control a diffusion rate of the material of the current collector. The present invention can provide a suitable method for mass production.

Preferably, the step of oxidation and the step of forming the active material layer are performed without exposure of the surface of the current collector to the atmosphere. If the steps are planned in this way, the oxide film formed by the oxidizing treatment can avoid changes of the condition of the surface after formation, and the active material layer can be formed on the uniform surface of the oxide film.

It is preferable to sputter etch the surface of the current collector before the step of oxidizing treatment to remove a naturally formed oxide film, and to perform steps of sputter etching and oxidizing treatment without exposure of the surface of the current collector to the atmosphere. If the process is conducted in such a way, the oxide film formed by the oxidizing treatment is uniform and has good repeatability because the treatment is performed without exposure to the atmosphere after a naturally formed oxide film having a varied oxidation degree is removed by the sputter etching.

It is preferable that the current collector surface is uneven. If the surface is uneven, contact area of the current collector and the active material layer can be increased to increase adhesion between the current collector and the active material layer. The surface of the active material layer formed on the current collector is also uneven if the surface of the current collector is uneven. A depression (or valley) on the surface helps to reduce vertical direction stress which occurs when the active, material layer expands during charge and discharge. Peeling of the active material caused by such stress can also be prevented. This also helps to improve charge-discharge characteristics.

The current collector preferably includes copper (Cu). Cu has a larger diffusion coefficient as compared to Si or Ge. Therefore, it is easily diffused into an active material layer including at least one of Si and Ge. Even if the current collector includes Cu having a large diffusion coefficient, the oxidizing treatment of the present invention inhibits diffusion of Cu into the active material layer.

DESCRIPTION OF PREFERRED EMBODIMENT

An electrode manufacturing apparatus used in the following Examples is described below before explanation of examples of the method for manufacturing an electrode for a lithium secondary battery of the present invention. FIG. 1 is a drawing illustrating the structure of the electrode manufacturing apparatus used in the examples of the present invention. The electrode manufacturing apparatus is comprised of chamber 2, substrate holder 3 supported on an axis of rotation 3a in chamber 2 so as to be capable of rotating, sputter source 4 and ECR ion source 5 including gas supply line 6. A current collector 10 (20) is secured by substrate holder 3. Rotary pump 7 and turbo molecule pump 8 are connected to chamber 2.

Substrate holder 3 can be turned on the axis of rotation 3a by operation from outside of the chamber 2. This makes it possible for current collector 10 (20) secured on substrate holder 3 to face either the ECR ion source 5 or sputter source 4.

Electrodes for lithium secondary batteries in Examples 1–4 and Comparative Examples 1–4 were prepared using the above described electrode manufacturing apparatus. Electrodes a1–a4 were prepared using a current collector of rolled copper film in Examples 1 and 2 and Comparative Examples 1 and 2. Electrodes b1–b4 were prepared using a current collector of rough rolled copper film having an uneven surface in Examples 3 and 4 and Comparative Examples 3 and 4. Surface treatment for each current collector used for electrodes a1–a4 and b1–b4 is described in Table 1.

TABLE 1

| Electrode | Current Collector | Surface Treatment |
|---|---|---|
| a1 (Example 1) | Rolled Copper Film | Oxidizing Treatment |
| a2 (Example 2) | Rolled Copper Film | Sputter Etching→ Oxidizing Treatment |
| a3 (Comparative Example 1) | Rolled Copper Film | None |
| a4 (Comparative Example 2) | Rolled Copper Film | Sputter Etching |
| b1 (Example 3) | Rough (Surface) Rolled Copper Film | Oxidizing Treatment |
| b2 (Example 4) | Rough (Surface) Rolled Copper Film | Sputter Etching→ Oxidizing Treatment |
| b3 (Comparative Example 3) | Rough (Surface) Rolled Copper Film | None |
| b4 (Comparative Example 4) | Rough (Surface) Rolled Copper Film | Sputter Etching |

Examples 1–4 and Comparative Examples 1–4 are described below with reference to Table 1.

EXAMPLE 1

A rolled copper film having a thickness of about 18 μm was used as current collector 10 for electrode a1 in Example 1. In Example 1, as described in Table 1, only an oxidizing treatment was conducted on the surface of current collector 10 before an active material layer (Si thin layer) was formed.

Figure 2:
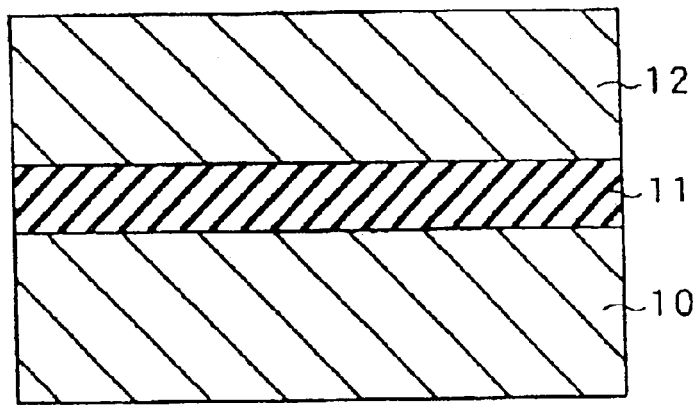
FIG. 2 is a cross section of an electrode for a lithium secondary battery of Example 1.

Concretely, current collector 10, i.e., the rolled copper film, was secured on substrate holder 3 in the electrode manufacturing apparatus 1, and then current collector 10 and ECR ion source 5 were arranged facing each other by rotating substrate holder 3. Chamber 2 was evacuated to $1\times10^{-4}$ Pa by rotary pump 7 and turbo molecule pump 8. Oxidizing treatment of current collector 10 was performed at $1\times10^{-4}$ Pa under the conditions shown in Table 2. That is, at a microwave power of 330 W, $O_2$ flow rate of 60 sccm, gas pressure of $1.5\times10^{-1}$ Pa, and ion accelerating voltage of 200 V, an oxidizing treatment was conducted to form an oxide film 11 on the surface of current collector 10 as shown in FIG. 2.

TABLE 2

| Oxidizing Condition | |
|---|---|
| Microwave Power | 330 W |
| $O_2$ Flow rate | 60 sccm |
| Gas Pressure | $1.5 \times 10^{-1}$ Pa |
| Ion Accelerating Voltage | 200 V |
| Treatment Time | 5 min. |

Then current collector 10 and sputter source 4 were caused to face each other by rotating substrate holder 3.

After changing the gas flowing to chamber 2 from $O_2$ gas to Ar gas, active material layer 12 which is a Si thin layer was formed on oxide film 11 under the conditions shown in Table 3. That is, at an RF power of 330 W, Ar flow rate of 50 sccm and gas pressure of $1\times10^{-1}$ Pa, active material layer 12 comprising a Si thin layer and having a thickness of about 2 μm was formed by sputtering for 180 minutes.

The thickness of the active material layer can be controlled by the treatment time.

TABLE 3

| Sputtering Condition | |
| --- | --- |
| RF Power | 330 W |
| Ar Flow rate | 50 sccm |
| Gas Pressure | $1 \times 10^{-1}$ Pa |
| Treating Time | 180 min. |
| Thickness | 2 μm |

Formed active material layer 12 and current collector 10 were cut into a size of 2 cm×2 cm to prepare electrode a1 in Example 1.

EXAMPLE 2

A rolled copper film having a thickness of about 18 μm (the same as in Example 1) was used as current collector 10 for electrode a2 in Example 2. In Example 2, as shown in Table 1, removal of a naturally formed oxide film by sputter etching and an oxidizing treatment were conducted as surface treatments of current collector 10 before active material layer 12 of a Si thin layer was formed.

Concretely, current collector 10, the rolled copper film, was secured on substrate holder 3 in the electrode manufacturing apparatus 1, and then current collector 10 and ECR ion source 5 were made to face each other by rotating substrate holder 3. Chamber 2 was evacuated to $1\times10^{-4}$ Pa by rotary pump 7 and turbo molecule pump 8. Sputter etching was conducted under the conditions shown in Table 4. That is, a naturally formed oxide film on the surface of current collector 10 was removed under conditions of microwave power of 330 W, Ar flow rate of 40 sccm, gas pressure of $1.5\times10^{-1}$ Pa, and ion accelerating voltage of 200 V.

TABLE 4

| Sputter Etching Condition | |
| --- | --- |
| Microwave Power | 330 W |
| Ar Flow rate | 40 sccm |
| Gas Pressure | $1 \times 10^{-1}$ Pa |
| Ion Accelerating Voltage | 200 V |
| Treatment Time | 2 min. |

Then the gas flowing to chamber 2 was changed from Ar gas to $O_2$ gas. Oxide film 11 was formed on the clean surface of current collector 10, from which the naturally formed oxide film had been removed, by an oxidizing treatment for five minutes under the same conditions as in Example 1 (described in Table 2).

Then current collector 10 and sputter source 4 were made to face each other by rotating substrate holder 3. After changing the gas flowing to chamber 2 from $O_2$ gas to Ar gas, RF power was applied to sputter source 4 to form active material layer 12 having a thickness of about 2 μm which is a Si thin layer on oxide film 11 on the surface of current collector 10. The conditions of forming active material layer 12 were the same as in Example 1 as described in Table 3.

Finally, formed active material layer 12 and current collector 10 were cut into 2 cm×2 cm squares to prepare electrode a2 in Example 2.

COMPARATIVE EXAMPLE 1

A rolled copper film having a thickness of about 18 μm as in Example 1 was used as current collector 10 for electrode a3. As shown in Table 1, the surface of current collector 10 was not treated before an active material layer (Si thin layer) was formed.

Concretely, current collector 10, the rolled copper film was secured on substrate holder 3 in the electrode manufacturing apparatus 1, and then current collector 10 and sputter source 4 were made to face each other by rotating substrate holder 3. Chamber 2 was evacuated to $1\times10^{-4}$ Pa by rotary pump 7 and turbo molecule pump 8. An active material layer 12 having a thickness of about 2 μm which is Si thin layer was formed on the surface of current collector 10 under the same conditions as Example 1 as described in Table 3.

Finally, formed active material layer 12 and current collector 10 were cut into a size of 2 cm×2 cm to prepare electrode a3 in Comparative Example 1.

COMPARATIVE EXAMPLE 2

A rolled copper film having a thickness of about 18 μm as in Example 1 was used as current collector 10 for electrode a4 in Comparative Example 2. In Comparative Example 2, a naturally formed oxide film was removed by sputter etching as a surface treatment of current collector 10 before an active material layer (Si thin layer) was formed without an oxidizing treatment.

Concretely, current collector 10, the rolled copper film, was secured on substrate holder 3 in the electrode manufacturing apparatus 1, and then current collector 10 and ECR ion source 5 were made to face each other by rotating substrate holder 3. Chamber 2 was evacuated to $1\times10^{-4}$ Pa by rotary pump 7 and turbo molecule pump 8. The oxide film which was naturally formed on the surface of current collector 10 was removed by sputter etching for two minutes under the same conditions as in Example 2.

Then current collector 10 and sputter source 4 were made to face each other by rotating substrate holder 3. RF power was applied to sputter source 4 to form active material layer 12 having a thickness of about 2 μm which is a Si thin layer on the surface of current collector 10. Conditions to form the active material layer 12 were the same as in Example 1 as described in Table 3.

Finally, formed active material layer 12 and current collector 10 were cut into a size of 2 cm×2 cm to prepare electrode a4 in Comparative Example 2.

EXAMPLE 3

A rough (surface) rolled copper film having an uneven (or rough) surface and a thickness of about 26 μm was used as current collector 20 for electrode b1 in Example 3. The rough surface rolled copper film was prepared by electrolysis to deposit copper on its surface. As shown in Table 1 only an oxidizing treatment was conducted as a surface treatment of current collector 20 before an active material layer (Si thin layer) was formed.

Concretely, the rough (surface) rolled copper film was secured on substrate holder 3 in the electrode manufacturing apparatus 1, and then current collector 20 and ECR ion source 5 were made to face each other by rotating substrate holder 3. Chamber 2 was evacuated to $1\times10^{-4}$ Pa by rotary pump 7 and turbo molecule pump 8. Oxidizing treatment was conducted for five minutes under the same conditions as in Example 1 to form oxide film 21 on the surface of current collector 20.

Then current collector 20 and sputter source 4 were made to face each other by rotating substrate holder 3. After changing the gas flowing to chamber 2 from $O_2$ gas to Ar gas, RF power was applied to sputter source 4 to form active material layer 22 having a thickness of about 2 µm which is a Si thin layer on oxide layer 21 formed on the surface of current collector 20. Conditions to form the active material layer 22 were the same as Example 1 as described in Table 3.

Finally, formed active material layer 22 and current collector 20 were cut into a size of 2 cm×2 cm to prepare electrode b1 in Example 3.

EXAMPLE 4

A rough (surface) rolled copper film having an uneven surface and a thickness of about 26 µm as in Example 3 was used as current collector 20 for electrode b2 in Example 4. Removal of a naturally formed oxide film by sputter etching and an oxidizing treatment were conducted as surface treatments of current collector 20 before forming an active material layer (Si thin layer).

Concretely, current collector 20 was secured on substrate holder 3 in the electrode manufacturing apparatus 1, and then current collector 20 and ECR ion source 5 were made to face each other by rotating substrate holder 3. Chamber 2 was evacuated to $1\times10^{-4}$ Pa by rotary pump 7 and turbo molecule pump 8. The naturally formed oxide film was removed by sputter etching for two minutes under the same conditions as in Example 2 as described in Table 4.

Then the gas flowing to chamber 2 was changed from Ar gas to $O_2$ gas. Oxide film 21 was formed on the surface of current collector 20, from which the naturally formed oxide film was removed by oxidizing treatment for five minutes under the same conditions as in Example 1 described in Table 2.

Then current collector 20 and sputter source 4 were made to face each other by rotating substrate holder 3. After the gas flow to chamber 2 was changed from $O_2$ gas to Ar gas, RF power was applied to sputter source 4 to form active material layer 22 having a thickness of about 2 µm which is a Si thin layer on oxide layer 21 formed on the surface of current collector 20. Conditions to form the active material layer 22 were the same as in Example 1 as described in Table 3.

Finally, formed active material layer 22 and current collector 20 were cut into a size of 2 cm×2 cm to prepare electrode b2 in Example 4.

COMPARATIVE EXAMPLE 3

A rough (surface) rolled copper film having a thickness of about 26 µm as in Example 3 was used as current collector 20 for electrode b3 in Comparative Example 3. In Comparative Example 3, as shown in Table 1, the surface of current collector 10 was not treated before an active material layer (Si thin layer) was formed.

Concretely, the current collector 20 was secured on substrate holder 3 in the electrode manufacturing apparatus 1, and then current collector 20 and sputter source 4 were made to face each other by rotating substrate holder 3. Chamber 2 was evacuated to $1\times10^{-4}$ Pa by rotary pump 7 and turbo molecule pump 8. An active material layer 22 having a thickness of about 2 µm which is a Si thin layer was formed on the surface of current collector 20 under the same conditions as in Example 1 as described in Table 3.

Finally, formed active material layer 22 and current collector 20 were cut into a size of 2 cm×2 cm to prepare electrode b3 in Comparative Example 3.

COMPARATIVE EXAMPLE 4

A rough (surface) rolled copper film having a thickness of about 26 µm as in Example 3 was used as current collector 20 for electrode b4 in Comparative Example 4. In Comparative Example 4, a naturally formed oxide film was removed by sputter etching as a surface treatment for current collector 20 without an oxidizing treatment before the active material layer (Si thin layer) was formed.

Concretely, current collector 20 was secured on substrate holder 3 in the electrode manufacturing apparatus 1, and then current collector 20 and ECR ion source 5 were made to face each other by rotating substrate holder 3. Chamber 2 was evacuated to $1\times10^{-4}$ Pa by rotary pump 7 and turbo molecule pump 8. The oxide film which was naturally formed on the surface of current collector 20 was removed by sputter etching for two minutes under the same conditions as in Example 2 as described in Table 4.

Then current collector 20 and sputter source 4 were made to face each other by rotating substrate holder 3. RF power was applied to sputter source 4 to form active material layer 22 having a thickness of about 2 µm which is a Si thin layer on the surface of current collector 20. Conditions to form the active material layer 22 were the same as in Example 1 as described in Table 3.

Finally, formed active material layer 22 and current collector 20 were cut into a size of 2 cm×2 cm to prepare electrode b4 in Comparative Example 4.

Evaluation of Charge-Discharge Characteristics Using Single Electrode Test Cell

A test cell was prepared using each of electrodes a1–a4 and b1–b4 prepared in Examples 1–4 and Comparative Examples 1–4 as a working electrode, and lithium metal as an auxiliary electrode and a reference electrode. An electrolyte used was 1 mol/l of $LiPF_6$ dissolved in an equal volume solvent mixture of ethylene carbonate and diethylene carbonate. In this single electrode test cell, reduction of the working electrode is charge and oxidation is discharge.

Charge-discharge characteristic of each test cell corresponding to electrodes a1–a4 and b1–b4 was evaluated. The cell was charged at a temperature of 25° C., at a constant current of 2 mA until a potential of the auxiliary electrode relative to the reference electrode reached 0 V, and then was discharged until a potential of the auxiliary electrode reached 2 V. The charge and discharge were considered one cycle. The charge and discharge cycles were repeated ten times. An initial discharge capacity and discharge capacity maintenance rate at the $10^{th}$ cycle were measured. The discharge capacity maintenance rate at the $10^{th}$ cycle is a ratio of the $10^{th}$ cycle discharge capacity to the initial discharge capacity, and is defined as follows:

Discharge capacity maintenance rate at $10^{th}$ cycle (%)=($10^{th}$ cycle discharge capacity/initial discharge capacity)×100

The test results measured with the test cells using electrodes a1–a4 are shown in Table 5 and with the test cells using electrodes b1–b4 are shown in Table 6.

TABLE 5

| Electrode | Initial Discharge Capacity (mAh/cm²) | Initial Charge-Discharge Efficiency (%) | Discharge Capacity Maintenance Rate at 10th Cycle (%) |
| --- | --- | --- | --- |
| a1 (Example 1) | 1.558 | 91.1 | 35.2 |
| a2 (Example 2) | 1.571 | 90.2 | 32.1 |
| a3 (Comparative Example 1) | 0.415 | 72.4 | 10.2 |
| a4 (Comparative Example 2) | 0.213 | 64.1 | 12.2 |

TABLE 6

| Electrode | Initial Discharge Capacity (mAh/cm²) | Initial Charge-Discharge Efficiency (%) | Discharge Capacity Maintenance Rate at 10th Cycle (%) |
| --- | --- | --- | --- |
| b1 (Example 3) | 1.712 | 95.4 | 98.8 |
| b2 (Example 4) | 1.745 | 95.2 | 98.4 |
| b3 (Comparative Example 3) | 1.469 | 95.3 | 101.1 |
| b4 (Comparative Example 4) | 1.183 | 93.4 | 98.6 |

From the results shown in Tables 5 and 6, electrodes a1, a2, b1 and b2 in Examples 1–4, in which oxidizing treatments were conducted before formation of an active material layer, had greater initial capacity as compared with electrodes a3, a4, b3 and b4 in Comparative Examples 1–4 in which an oxidizing treatment was not conducted. The reason for this is that an oxide film formed by an oxidizing treatment of the surface of a current, collector inhibits formation of a compound by reaction of the current collector and Si. A phenomena caused by the compound created by the reaction of the current collector and Si, i.e., charge and discharge not occurring, is inhibited. Therefore, charge-discharge capacity increases.

When electrodes a4 and b4 in Comparative Examples 2 and 4 were prepared without oxidizing treatment and with sputter etching, the smallest initial capacity among the prepared current collectors was exhibited. This is because a reaction of a current collector and an active material layer at their interface occurs very violently because a naturally formed oxide film is removed by sputter etching. As shown in the results with electrodes a2 and b2 of Examples 2 and 4, when an oxidizing treatment was done after sputter etching, the initial discharge capacity was significantly increased. An oxide film created by the oxidizing treatment inhibits the reaction at the interface between the current collector and the active material layer.

Figure 3:
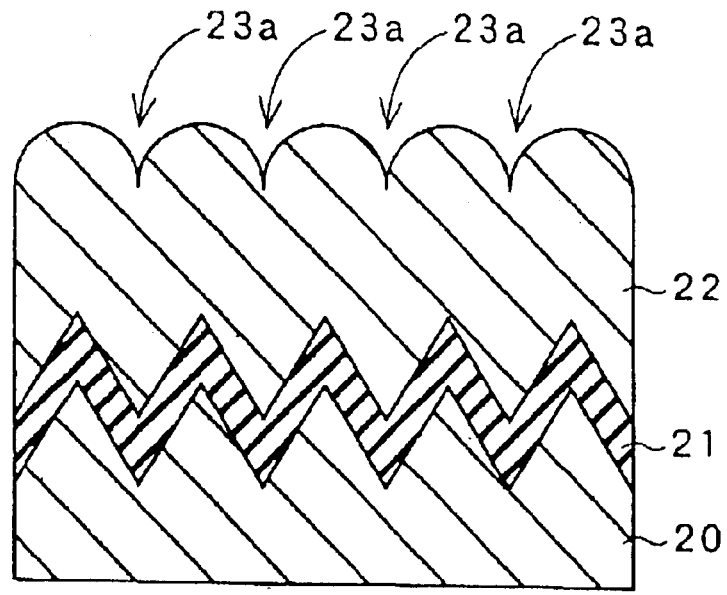
FIG. 3 is a cross section of an electrode for a lithium secondary battery of Examples 3 and 4.
Figure 4:
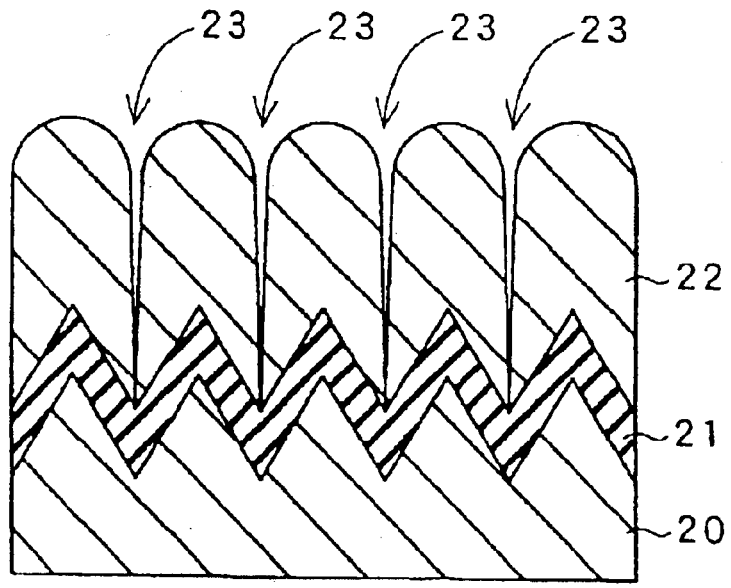
FIG. 4 is a cross section of the electrode shown in FIG. 3 after several times charge and discharge.

Electrodes b1 and b2 prepared with a rough (surface) rolled copper film having an uneven surface in Examples 3 and 4 have higher capacity maintenance rate relative to electrodes a1 and a2 prepared with a rolled copper film not having an uneven surface. There are believed to be two reasons for this. First, as shown in FIG. 3, when oxide film 21 and active material layer (Si thin layer) 22 are formed on the current collector comprising the rough (surface) rolled copper film having an uneven surface, the surface of the active material layer formed on current collector 20 having an uneven surface is also uneven. Adherence of the active material layer to the current collector increases because the surface area increases. As a result, peeling of active material layer 22 from current collector 20 is inhibited and a high capacity maintenance rate can be obtained. Second, active material layer 22 occludes and discharges lithium during charge and discharge and the active material layer undergoes repeated expansion and contraction. Stress concentrates in depressions (valleys) 23a of active material layer 22 having the uneven surface to create cracks 23 as shown in FIGS. 3 and 4. Such cracks 23 ease stress caused by expansion and contraction of active material layer 22 during charge. As a result, a high capacity maintenance rate can be obtained due to inhibition of peeling of active material layer 22 from current collector 20. International publication No. WO01/29918 discloses this matter in detail.

As described above, the present invention is successful in increasing initial discharge capacity by an oxidizing treatment before formation of an active material layer. It is possible to control evenly and suitably the degree of diffusion of components of the current collector to the active material layer because a uniform oxide film can be formed with good reproducibility on the surface of the current collector by the oxidizing treatment after removal by sputter etching of a naturally formed oxide film which has as uneven degree of oxidation.

The above described examples are illustrative of the present invention, and do not limit of the scope of the invention. The scope of the invention is defined by claims not examples, and all modifications are included in the invention within the scope and spirit of the appended claims.

For example, in the above examples, an oxide film was formed by exposing a current collector to a gas containing oxygen. However, the present invention is not limited to this method, and other methods can be applied to form an oxide film. The oxide film can be formed by exposing the current collector to a liquid or gas which works as an oxidant.

Si was used as the active material layer in the above examples. However, the present invention is not limited to this material, and other materials can be used. For example, an active material layer can contain at least either Si or Ge. Specifically, the present invention is effective when an active material contains at least Si or Ge. The thickness of the active material is 2 μm in the above examples. However, the present invention is not limited to this thickness. Preferably, the thickness is below 10 μm in order to prevent the active material from collapse during charge-discharge cycle.

Sputtering was illustrated as a method in which a material is provided by emitting in a vapor phase in the above examples. The present invention is not limited to sputtering. The present invention can provide similar results when other methods to provide the material by emitting in the vapor phase are used, for example, vapor deposition, CVD, and the like.

A current collector comprising Cu was used in the above examples, but the present invention is not limited to Cu. A current collector can be made using other materials.

ADVANTAGES OF THE INVENTION

The present invention can provide a method to manufacture an electrode for a lithium secondary battery to make it possible to prepare a lithium secondary battery having high charge-discharge capacity and excellent charge-discharge cycle characteristics.

What is claimed is:

1. A method for manufacturing an electrode for a lithium secondary battery comprising
   forming a oxide film other than a naturally formed oxide film by oxidizing a surface of a current collector; and then forming an active material layer containing at least Si or Ge on said current collector by providing a material by emitting in a vapor phase.

2. The method for manufacturing an electrode for a lithium secondary battery according to claim 1, wherein said step of forming the oxide film and said step of forming the active material layer are performed without exposure to the atmosphere.

3. The method for manufacturing an electrode for a lithium secondary battery according to claim 2, further comprising, before said step of forming the oxide film, a step of removing a naturally formed oxide film by sputter etching the surface of the current collector; said sputter etching step and said step of forming the oxide film being performed without exposure to the atmosphere.

4. The method for manufacturing an electrode for a lithium secondary battery according to claim 3, wherein said current collector contains copper (Cu).

5. The method for manufacturing an electrode for a lithium secondary battery according to claim 2, wherein said current collector contains copper (Cu).

6. The method for manufacturing an electrode for a lithium secondary battery according to claim 1, further comprising, before said step of forming the oxide film, a step of removing a naturally formed oxide film by sputter etching the surface of the current collector; said sputter etching step and said step of forming the oxide film being performed without exposure to the atmosphere.

7. The method for manufacturing an electrode for a lithium secondary battery according to claim 6, wherein said current collector contains copper (Cu).

8. The method for manufacturing an electrode for a lithium secondary battery according to claim 1, wherein said current collector contains copper (Cu).

* * * * *